(12) United States Patent
Choi et al.

(10) Patent No.: US 12,130,552 B2
(45) Date of Patent: *Oct. 29, 2024

(54) COMPOSITION FOR RESIST UNDERLAYER, AND PATTERN FORMING METHOD USING SAME

(71) Applicant: Samsung SDI Co., Ltd., Yongin-si (KR)

(72) Inventors: Yoojeong Choi, Suwon-si (KR); Soonhyung Kwon, Suwon-si (KR); Minsoo Kim, Suwon-si (KR); Hyeon Park, Suwon-si (KR); Shinhyo Bae, Suwon-si (KR); Jaeyeol Baek, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 583 days.

This patent is subject to a terminal disclaimer.

(21) Appl. No.: 17/419,657

(22) PCT Filed: Mar. 23, 2020

(86) PCT No.: PCT/KR2020/003965
§ 371 (c)(1),
(2) Date: Jun. 29, 2021

(87) PCT Pub. No.: WO2020/204431
PCT Pub. Date: Oct. 8, 2020

(65) Prior Publication Data
US 2022/0075266 A1 Mar. 10, 2022

(30) Foreign Application Priority Data
Mar. 29, 2019 (KR) .......................... 10-2019-0037030

(51) Int. Cl.
| | |
|---|---|
| *G03F 7/11* | (2006.01) |
| *G03F 7/004* | (2006.01) |
| *G03F 7/09* | (2006.01) |
| *G03F 7/16* | (2006.01) |

(52) U.S. Cl.
CPC .............. *G03F 7/11* (2013.01); *G03F 7/0045* (2013.01); *G03F 7/091* (2013.01); *G03F 7/092* (2013.01); *G03F 7/094* (2013.01); *G03F 7/162* (2013.01)

(58) Field of Classification Search
CPC . G03F 7/11; G03F 7/091; G03F 7/092; G03F 7/094
See application file for complete search history.

(56) References Cited

U.S. PATENT DOCUMENTS

| | | | |
|---|---|---|---|
| 8,501,383 B2 | 8/2013 | Zampini et al. | |
| 9,023,588 B2 | 5/2015 | Nakajima et al. | |
| 11,249,396 B2 * | 2/2022 | Park | G03F 7/091 |
| 2004/0110096 A1 | 6/2004 | Kishioka et al. | |

(Continued)

FOREIGN PATENT DOCUMENTS

| | | |
|---|---|---|
| CN | 102245663 A | 11/2011 |
| CN | 103415809 A | 11/2013 |

(Continued)

OTHER PUBLICATIONS

International Search Report for corresponding Application No. PCT/KR2020/003965 dated Jun. 24, 2020, 4pp.

(Continued)

*Primary Examiner* — Cynthia H Kelly
*Assistant Examiner* — Anna Malloy
(74) *Attorney, Agent, or Firm* — Lewis Roca Rothgerber Christie LLP

(57) ABSTRACT

A resist underlayer composition and a method of forming patterns using the same is disclosed. The resist underlayer composition includes a polymer including a structure represented by Chemical Formula 1 at the terminal end and a structural unit represented by Chemical Formula 2 and a structural unit represented by Chemical Formula 3 in the main chain; and a solvent. Definitions of Chemical Formula 1 to Chemical Formula 3 are the same as described in the detailed description.

[Chemical Formula 1]

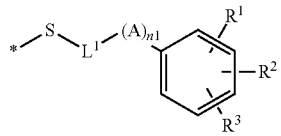

[Chemical Formula 2]

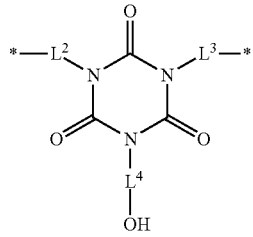

(Continued)

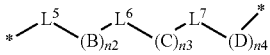

[Chemical Formula 3]

14 Claims, No Drawings

(56) References Cited

U.S. PATENT DOCUMENTS

| | | | |
|---|---|---|---|
| 2010/0009297 A1 | 1/2010 | Yao et al. | |
| 2010/0047713 A1 | 2/2010 | Murofushi | |
| 2013/0196114 A1 | 8/2013 | Urano et al. | |
| 2014/0004465 A1 | 1/2014 | Ohnishi et al. | |
| 2015/0332931 A1 | 11/2015 | Nam et al. | |
| 2016/0053087 A1 | 2/2016 | Ogihara et al. | |
| 2017/0045820 A1* | 2/2017 | Sakaida | C08G 73/0655 |
| 2017/0199459 A1 | 7/2017 | Ryu et al. | |
| 2018/0081274 A1 | 3/2018 | Ogata et al. | |
| 2018/0224744 A1* | 8/2018 | Bae | H01L 21/3081 |
| 2020/0285153 A1* | 9/2020 | Park | G03F 7/11 |

FOREIGN PATENT DOCUMENTS

| | | |
|---|---|---|
| CN | 105093834 A | 11/2015 |
| CN | 105837798 A | 8/2016 |
| CN | 106233207 A | 12/2016 |
| CN | 108388079 A | 8/2018 |
| JP | 4247643 B2 | 4/2009 |
| JP | 4760463 B2 | 8/2011 |
| JP | 2011-527461 A | 10/2011 |
| JP | WO2013/141015 A1 | 9/2013 |
| JP | 5679129 B2 | 3/2015 |
| JP | 2015-145944 A | 8/2015 |
| JP | 2015-172606 A | 10/2015 |
| JP | WO2014/014034 A1 | 7/2016 |
| JP | 2016-222761 A | 12/2016 |
| JP | 6072107 B2 | 2/2017 |
| JP | 6083537 B2 | 2/2017 |
| JP | 2018-124546 A | 8/2018 |
| JP | 2018-173520 A | 11/2018 |
| JP | 2018-173521 A | 11/2018 |
| KR | 10-2011-0095362 A | 8/2011 |
| KR | 10-2014-0006794 A | 1/2014 |
| KR | 10-2014-0012111 A | 1/2014 |
| KR | 10-2014-0050046 A | 4/2014 |
| KR | 10-2014-0085123 A | 7/2014 |
| KR | 10-2015-0027012 A | 3/2015 |
| KR | 10-1530197 B1 | 6/2015 |
| KR | 10-2016-0014724 A | 2/2016 |
| KR | 10-2016-0060035 A | 5/2016 |
| KR | 10-2016-0102175 A | 8/2016 |
| KR | 10-2016-0112847 A | 9/2016 |
| KR | 10-2016-0138397 A | 12/2016 |
| KR | 10-2016-0146691 A | 12/2016 |
| KR | 10-2017-0014120 A | 2/2017 |
| KR | 10-2017-0084820 A | 7/2017 |
| KR | 10-1764259 B1 | 8/2017 |
| KR | 10-1771543 B1 | 8/2017 |
| KR | 10-1804392 B1 | 12/2017 |
| KR | 10-2018-0090640 A | 8/2018 |
| KR | 10-2018-0121205 A | 11/2018 |
| KR | 10-2019-0078309 A | 7/2019 |
| TW | 201346451 A | 11/2013 |
| TW | 201518867 A | 5/2015 |
| TW | 201704279 A | 2/2017 |
| TW | 201829613 A | 8/2018 |
| WO | 2005/088398 A1 | 9/2005 |
| WO | 2009/096340 A1 | 8/2009 |
| WO | WO 2012/124597 A1 | 9/2012 |
| WO | WO 2013/141015 A1 | 9/2013 |
| WO | WO 2014/017331 A1 | 1/2014 |
| WO | 2015/163195 A1 | 10/2015 |
| WO | WO 2015/169908 A1 | 11/2015 |

OTHER PUBLICATIONS

Notice of Allowance for Korean Patent Application No. 10-2019-0037030 dated May 2, 2022, 2 pages.
Japanese Office Action dated Sep. 6, 2022, issued in corresponding Japanese Patent Application No. 2021-545406 (2 pages).
Office action dated Mar. 28, 2024 issued in corresponding Chinese Patent Application No. 202080012809.X, 7pp.
JPO Notice of Allowance dated Sep. 21, 2021, issued in corresponding Japanese Patent Application No. 2020-023469, 3 pages.
JPO Office Action issued in JP Patent Application No. 2020-023469 dated Jan. 12, 2021, 3 pages.
KIPO Notice of Allowance dated Nov. 1, 2021, issued in corresponding Korean Patent Application No. 10-2019-0025943, 2 pages.
TPO Office Action issued in TW Patent Application No. 109105331 dated Jan. 19, 2021, 4 pages.

* cited by examiner

COMPOSITION FOR RESIST UNDERLAYER, AND PATTERN FORMING METHOD USING SAME

CROSS-REFERENCE TO RELATED APPLICATIONS

This application is a U.S. National Phase Patent Application of International Application Number PCT/KR2020/003965, filed on Mar. 23, 2020, which claims priority to Korean Patent Application Number 10-2019-0037030, filed on Mar. 29, 2019, the entire content of both of which is incorporated herein by reference.

TECHNICAL FIELD

The present invention relates to a resist underlayer composition and a method of forming patterns using the same. More particularly, this disclosure relates to a photoresist underlayer composition for an underlayer formed between a semiconductor substrate and a photoresist layer and a method of forming a photoresist pattern using the underlayer.

BACKGROUND ART

Recently, a semiconductor industry has developed to an ultra-fine technique having a pattern of several to several tens nanometer size. Such ultrafine technique essentially needs effective lithographic techniques.

The lithographic technique includes coating a photoresist layer on a semiconductor substrate such as a silicon wafer, exposing and developing it to form a thin layer, irradiating activating radiation such as ultraviolet (UV) while disposing a mask pattern having a pattern of a device, developing the resultant to obtain a photoresist pattern, etching the substrate using the photoresist pattern as a protective layer to form a fine pattern corresponding to the photoresist pattern on the surface of the substrate.

As technology of manufacturing an ultra-fine pattern is required, an activating radiation having a short wavelength such as an i-line (365 nm), a KrF excimer laser (wavelength of 248 nm), an ArF excimer laser (wavelength of 193 nm), and the like is used for exposure of a photoresist. Accordingly, research on solving a problem of the activating radiation due to a diffused reflection from a semiconductor substrate, a standing wave, or the like has been made by interposing a resist underlayer having optimal reflectance between the photoresist and the semiconductor substrate.

On the other hand, a high energy ray such as EUV (extreme ultraviolet, a wavelength of 13.5 nm), an E-beam (electron beam), and the like as a light source for manufacturing the fine pattern in addition to the activating radiation has been used, and the light source has no reflection from the substrate, but research on improving adherence of the resist to the lower layer has been widely made to improve a collapse of the pattern. In addition, research on improvement of etch selectivity and chemical resistance of the resist underlayer in addition to decrease of the problems caused by the light source has been widely made.

DISCLOSURE

Technical Problem

An embodiment provides a resist underlayer composition having a coating property, adherence, and chemical resistance.

Another embodiment provides a method of forming patterns using the resist underlayer composition.

Technical Solution

According to an embodiment, a resist underlayer composition includes a polymer including a structure represented by Chemical Formula 1 at the terminal end and a structural unit represented by Chemical Formula 2 and a structural unit represented by Chemical Formula 3 in the main chain; and a solvent.

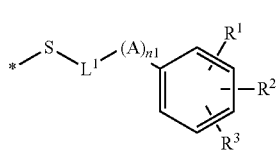

[Chemical Formula 1]

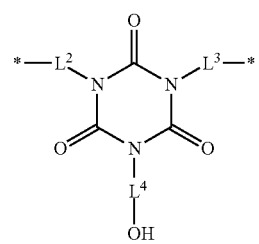

[Chemical Formula 2]

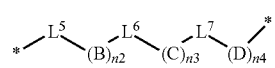

[Chemical Formula 3]

In Chemical Formula 1 to Chemical Formula 3, $L^1$ to $L^7$ are independently a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, A, B, C, and D are independently O, S, $S(O_2)$, C(O), C(O)O, $NR^a$, or $C(O)NR^b$, at least one of B, C, and D is S, n1, n2, n3, and n4 are independently one of integers of 0 to 3, provided that at least one of n2, n3, and n4 is an integer of 1 or more, $R^a$, $R^b$, and $R^1$ to $R^3$ are independently hydrogen, deuterium, a hydroxy group, a thiol group, a halogen, a carboxyl group, an acetyl group, an amino group, a cyano group, a nitro group, a substituted or unsubstituted C1 to C30 alkyl group, a substituted or unsubstituted C2 to C30 alkenyl group, a substituted or unsubstituted C6 to C30 aryl group, a substituted or unsubstituted C1 to C10 alkoxy group, a substituted or unsubstituted C1 to C30 acyl group, or a combination thereof, and

* is a linking point.

According to another embodiment, a method of forming patterns includes forming an etching object layer on a substrate, coating the resist underlayer composition on the etching object layer to form a resist underlayer, forming a photoresist pattern on the resist underlayer, and etching the resist underlayer and the etching object layer sequentially using the photoresist pattern as an etching mask.

Advantageous Effects

A resist underlayer having improved coating property, adherence, and chemical resistance may be provided.

BEST MODE

Exemplary embodiments of the present disclosure will hereinafter be described in detail, and may be easily performed by a person skilled in the art. However, this disclosure may be embodied in many different forms and is not construed as limited to the embodiments set forth herein.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, "substituted" refers to replacement of a hydrogen atom of a compound by a substituent selected from a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to one including 1 to 10 heteroatoms selected from N, O, S, and P.

As used herein, when a definition is not otherwise provided, "*" indicates a linking point of a compound or a compound moiety.

Hereinafter, a resist underlayer composition according to an embodiment is described.

A resist underlayer composition according to an embodiment includes a polymer including a structure represented by Chemical Formula 1 at the terminal end and a structural unit represented by Chemical Formula 2 and a structural unit represented by Chemical Formula 3 in the main chain; and a solvent.

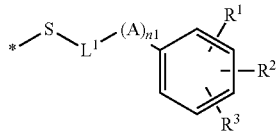

[Chemical Formula 1]

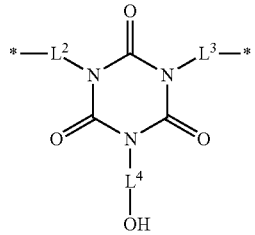

[Chemical Formula 2]

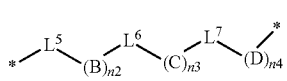

[Chemical Formula 3]

In Chemical Formula 1 to Chemical Formula 3, $L^1$ to $L^7$ are independently a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, A, B, C, and D are independently O, S, $S(O_2)$, C(O), C(O)O, $NR^a$, or $C(O)NR^b$, at least one of B, C, and D is S, n1, n2, n3, and n4 are independently one of integers of 0 to 3, provided that at least one of n2, n3, and n4 is an integer of 1 or more, $R^a$, $R^b$ and $R^1$ to $R^3$ are independently hydrogen, deuterium, a hydroxy group, a thiol group, a halogen, a carboxyl group, an acetyl group, an amino group, a cyano group, a nitro group, a substituted or unsubstituted C1 to C30 alkyl group, a substituted or unsubstituted C2 to C30 alkenyl group, a substituted or unsubstituted C6 to C30 aryl group, a substituted or unsubstituted C1 to C10 alkoxy group, a substituted or unsubstituted C1 to C30 acyl group, or a combination thereof, and

* is a linking point.

The structure represented by Chemical Formula 1 present at the terminal end of the polymer is a structure in which substituted or unsubstituted benzene is linked to the main chain of the polymer through a thiol ether bond.

As such, by introducing a substituted or unsubstituted benzene linked to the terminal end of the polymer through a thiol ether as a functional group, a polarity of the composition may be controlled, and thus, when the composition is used as a photoresist underlayer material, improved surface properties such as a high film density, coating uniformity, and improved adhesion may be achieved.

The polarity of the composition may be adjusted according to the functional group of benzene, which is a terminal substituent and for example $R^1$ to $R^3$ may independently be hydrogen, a hydroxy group, a thiol group, a halogen, a carboxyl group, an amino group, a cyano group, a nitro group, a substituted or unsubstituted C1 to C30 alkyl group, a substituted or unsubstituted C2 to C30 alkenyl group, a substituted or unsubstituted C6 to C30 aryl group, a substituted or unsubstituted C1 to C10 alkoxy group, a substituted or unsubstituted C1 to C30 acyl group, or a combination thereof.

In an embodiment, $R^1$ to $R^3$ may independently be hydrogen, a hydroxy group, a halogen, a carboxyl group, a carboxymethyl group, an acetyl group, or a combination thereof.

For example, Chemical Formula 1 may be represented Chemical Formula 1-1.

[Chemical Formula 1-1]

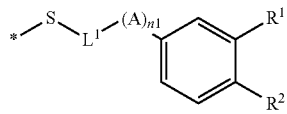

In Chemical Formula 1-1, $R^1$ and $R^2$ are the same as described above, $L^1$ is a single bond or a substituted or unsubstituted C1 to C30 alkylene group, A is O, S, S(O$_2$), C(O), C(O)O, NR$^a$, or C(O)NR$^b$, and n1 is one of integers of 0 to 3.

Meanwhile, the thiol ether bond of the polymer may be formed by a polymerization reaction through a thiol-ene reaction.

The thiol-ene reaction means any reaction that may form a thiol ether bond by addition reaction between a carbon-carbon double bond and a thiol functional group. The reaction may occur not only through radical initiation mechanisms, but also by nucleophilic addition reactions.

For example, it is carried out under a photoinitiated radical condition and may proceed through a typical chain growth reaction consisting of initiation, propagation, and termination steps.

As an example, a terminal-forming compound used for synthesizing the polymer may include substituted or unsubstituted benzene including a thiol functional group and substituted or unsubstituted benzene including an alkene functional group.

For example, the terminal-forming compound used in the synthesis of the polymer may be selected from the compounds of Group I, but is not limited thereto.

[Group I]

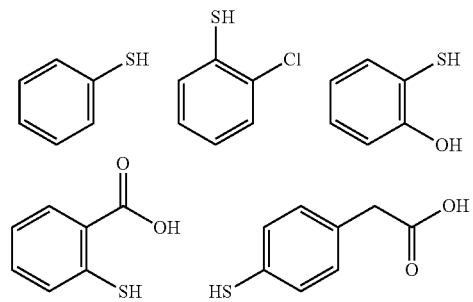

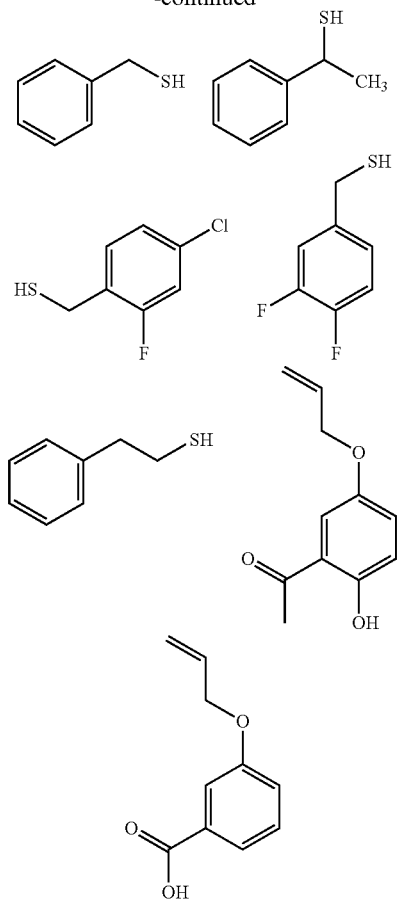

The structural unit represented by Chemical Formula 2 has a structure in which a heterocycloalkylene backbone is present in the core and three oxygen atoms are linked to the heterocycloalkylene. By having such a structure, it may have a high etch selectivity with the photoresist layer in the etching process, and excellent flatness may be provided.

The structural unit represented by Chemical Formula 2 may include at least one hydroxyl group, and due to such a structure, it is possible to further ensure uniformity of the coating.

In addition, by including the structural unit represented by Chemical Formula 3, sulfur (S) may be included in the main chain of the polymer. In this case, it may have a faster etching rate.

For example, the polymer may include at least one of structural units represented by Chemical Formula 4 to Chemical Formula 6.

[Chemical Formula 4]

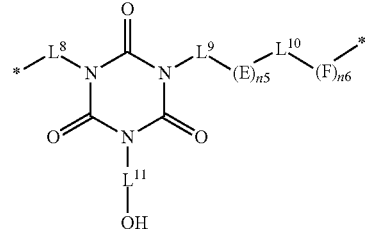

[Chemical Formula 5]

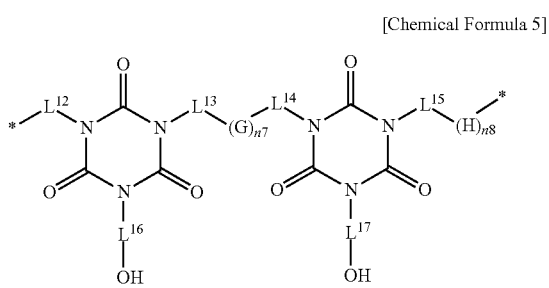

[Chemical Formula 6]

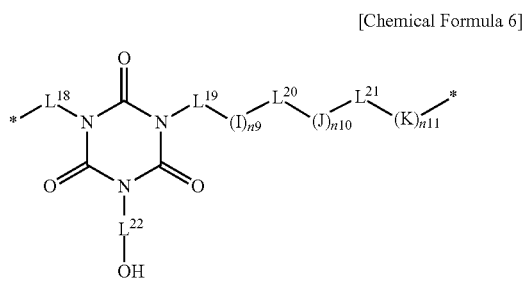

In Chemical Formula 4 to Chemical Formula 6, $L^8$ to $L^{22}$ are independently a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, E, F, G, H, I, J, and K are independently O, S, $S(O_2)$, C(O), C(O)O, $NR^a$, or $C(O)NR^b$, at least one of E and F is S, at least one of G and H is S, at least one of I, J, and K is S, n5 to n11 are independently one of integers of 0 to 3, at least one of n5 and n6 is an integer of 1 or more, at least one of n7 and n8 is an integer of 1 or more, at least one of n9 to n11 is an integer of 1 or more, and

* is a linking point.

For example, the polymer may include a moiety represented by one of Chemical Formula 7 to Chemical Formula 11.

[Chemical Formula 7]

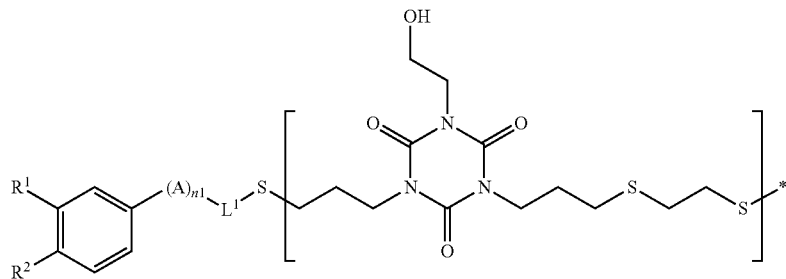

[Chemical Formula 8]

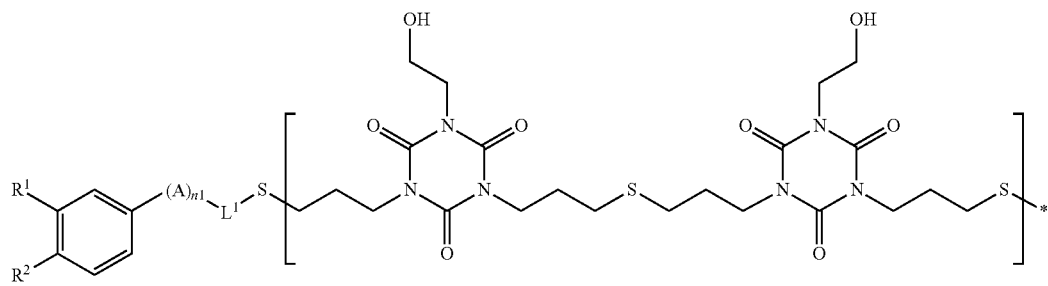

[Chemical Formula 9]

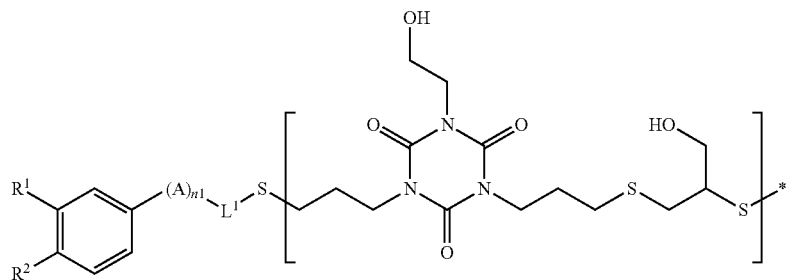

[Chemical Formula 10]

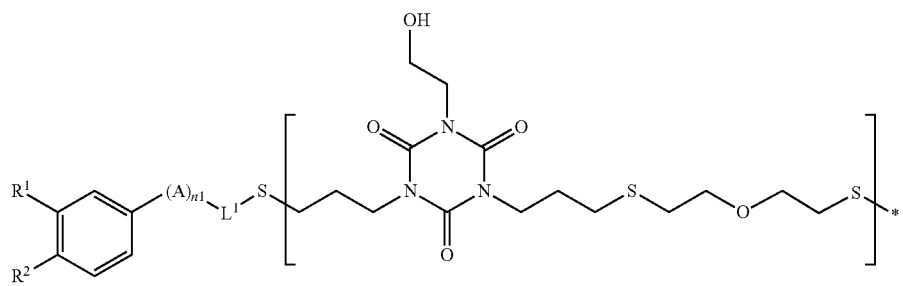

[Chemical Formula 11]

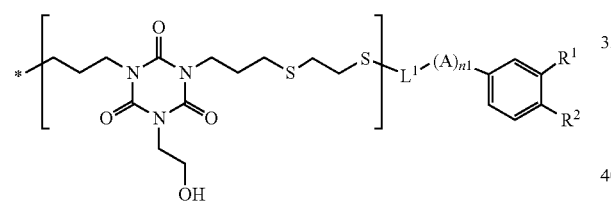

In Chemical Formula 7 to Chemical Formula 11, $L^1$ is a single bond or a substituted or unsubstituted C1 to C30 alkylene group, A is O, S, S(O$_2$), C(O), C(O)O, NR$^a$, or C(O)NR$^b$, and n1 is one of integers of 0 to 3, and $R^1$ and $R^2$ are independently hydrogen, a hydroxy group, a halogen, carboxymethyl group, an acetyl group, or a combination thereof.

In an embodiment, the polymer may include a moiety represented by one of Chemical Formula 12 to Chemical Formula 16, but is not limited thereto.

[Chemical Formula 12]

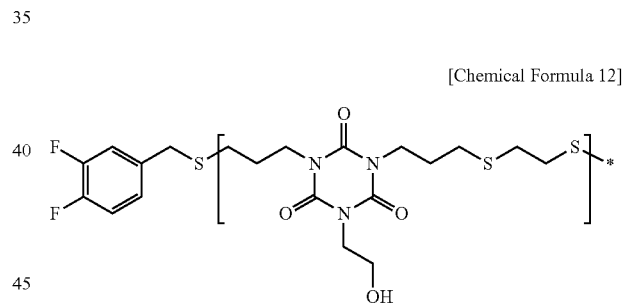

[Chemical Formula 13]

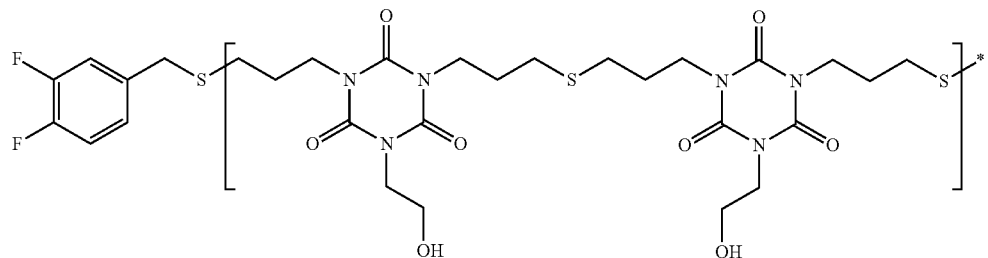

[Chemical Formula 14]

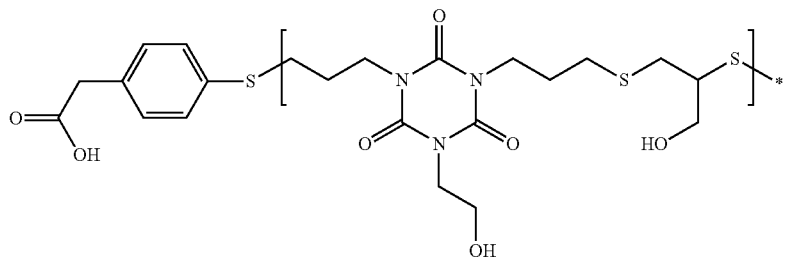

[Chemical Formula 15]

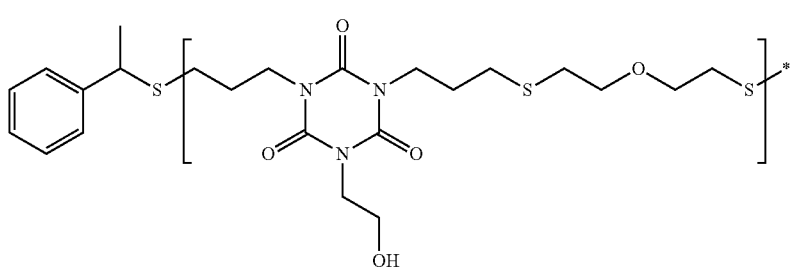

[Chemical Formula 16]

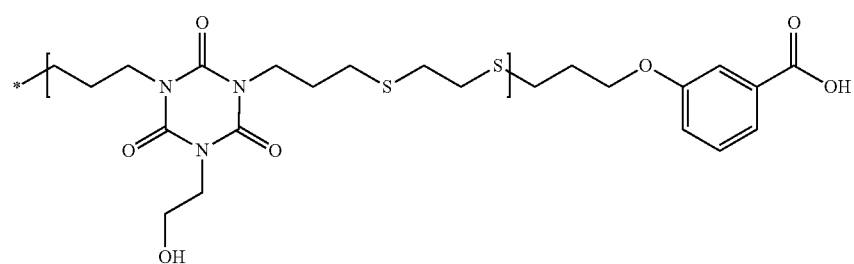

The linking group represented by $L^1$ to $L^{22}$ may be unsubstituted or at least one of hydrogen atoms constituting the linking group may be replaced by a at least one of groups including a C1 to C5 alkyl group, a halogen, a hydroxy group (—OH), an amino group (—$NH_2$), a carboxyl group (—COOH), an amide group (—$CONH_2$), or a thiol group (—SH).

The polymer has improved solubility and thus may form a resist underlayer having excellent coating uniformity. When the polymer is used as a material for a resist underlayer, a uniform thin layer may not only be obtained without forming a pin-hole or a void and deteriorating a thickness distribution during a baking process, but excellent gap-fill and planarization characteristics may also be obtained when a lower substrate (or a layer) has a step or is patterned.

The polymer may have a weight average molecular weight of 1,000 to 100,000. Specifically, the polymer may have a weight average molecular weight of 1,000 to 50,000, and more specifically 1,000 to 20,000. When the polymer has a weight average molecular weight within the ranges, a resist underlayer composition including the polymer may be optimized by adjusting a carbon content and solubility in a solvent.

The polymer may be included in an amount of 0.1 to 50 wt %, 0.1 to 30 wt %, or 0.1 to 10 wt % based on a total amount of the resist underlayer composition. When the polymer is included within the ranges, a thickness, surface roughness and planarization of the resist underlayer may be controlled.

The solvent may be anyone having sufficient solubility or dispersion for the polymer, and is not particularly limited, and may be, for example at least one selected from propylene glycol, propylene glycol diacetate, methoxy propanediol, diethylene glycol, diethylene glycol butylether, tri (ethylene glycol) monomethylether, propylene glycol monomethylether, propylene glycol monomethylether acetate, methyl alpha-hydroxyisobutyrate, ethyl alpha-hydroxyisobutyrate, methyl 3-methoxypropionate, cyclohexanone, ethyllactate, gamma-butyrolactone, N,N-dimethyl formamide, N,N-dimethyl acetamide, methylpyrrolidone, methylpyrrolidinone, acetylacetone, and ethyl 3-ethoxypropionate.

The resist underlayer composition may further include at least one other polymer of an acryl-based resin, an epoxy-based resin, a novolac resin, a glycoluril-based resin, and a melamine-based resin in addition to the polymer, but is not limited thereto.

The resist underlayer composition may further include at least one additive of a surfactant, a thermal acid generator, a plasticizer, and a combination thereof.

The surfactant may include for example an alkylbenzene sulfonate salt, an alkyl pyridinium salt, polyethylene glycol, or a quaternary ammonium salt, but is not limited thereto.

The thermal acid generator may be for example an acidic compound such as p-toluene sulfonic acid, trifluoromethane sulfonic acid, pyridinium p-toluene sulfonic acid, salicylic acid, sulfosalicylic acid, citric acid, benzoic acid, hydroxybenzoic acid, naphthalene carbonic acid, and the like or/and 2,4,4,6-tetrabromocyclohexadienone, benzointosylate, 2-nitrobenzyltosylate, other organosulfonic acid alkylester, and the like, but is not limited thereto.

The additive may be present in an amount of 0.001 parts by weight to 40 parts by weight based on 100 parts by weight of the resist underlayer composition. Within the ranges, solubility may be improved while optical properties of the resist underlayer composition are not changed.

According to another embodiment, a resist underlayer manufactured using the aforementioned resist underlayer composition is provided. The resist underlayer may be formed by coating the resist underlayer composition described above and curing it through a heat treatment and the heat treatment may be for example performed at a temperature of about 100° C. to 500° C.

For example, the resist underlayer may include an organic thin layer used in an electronic device such as a planarization layer, an anti-reflection coating, a sacrificial layer, or a filler.

MODE FOR INVENTION

Hereinafter, the present disclosure is described in more detail through Examples regarding synthesis of the polymer and preparation of a resist underlayer composition including the same. However, the present disclosure is technically not restricted by the following examples.

Synthesis of Polymers

Synthesis Example 1

10 g of 1,3-diallyl-5-(2-hydroxyethyl)-isocyanurate, 3.35 g of 1,2-ethanedithiol, 0.52 g of AIBN, and 10 g of N,N-dimethyl formamide (DMF) were put in a 100 mL round flask equipped with a condenser and then, heated while stirred with a magnetic bar to perform a polymerization reaction at 60° C. After the reaction proceeded for 3 hours, 1.9 g of 3,4-difluorobenzyl mercaptan was added thereto and additionally reacted for 1 hour, and then, the temperature was decreased down to room temperature (23° C. to 25° C.) to complete the reaction. Then, tetrahydrofuran (THF) was put for dilution in the reactor in which the polymerization was complete, and toluene, IPA (isopropyl alcohol), and heptane were used for purification to obtain a polymer (Mw=3,100) 10 including a moiety represented by Chemical Formula 12a.

[Chemical Formul 12a]

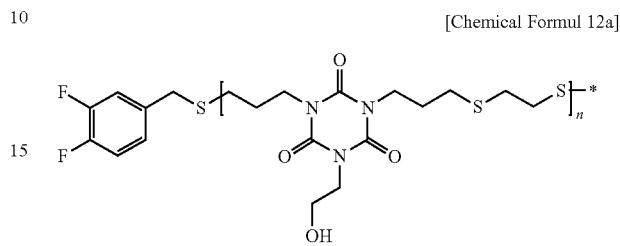

Synthesis Example 2

6 g of 1,3-diallyl-5-(2-hydroxyethyl)-isocyanurate, 6.1 g of 1,3-bis(3-mercaptopropyl)-5-(2-hydroxyethyl)-isocyanurate, 0.22 g of v-601, and 20 g of N,N-dimethyl formamide (DMF) were put in a 100 mL round flask equipped with a condenser and then, heated while stirred with a magnetic bar to perform a polymerization reaction at 75° C. After the reaction proceeded for 3 hours, 1.2 g of 3,4-difluorobenzyl mercaptan was added thereto and additionally reacted for 1 hour, and the temperature was decreased down to room temperature (23° C. to 25° C.) to complete a reaction. Then, tetrahydrofuran (THF) was put for dilution in a reactor in which the polymerization was complete, and toluene, IPA (isopropyl alcohol), and heptane were used for purification to obtain a polymer (Mw=3,500) including a moiety represented by Chemical Formula 13a.

[Chemical Formula 13a]

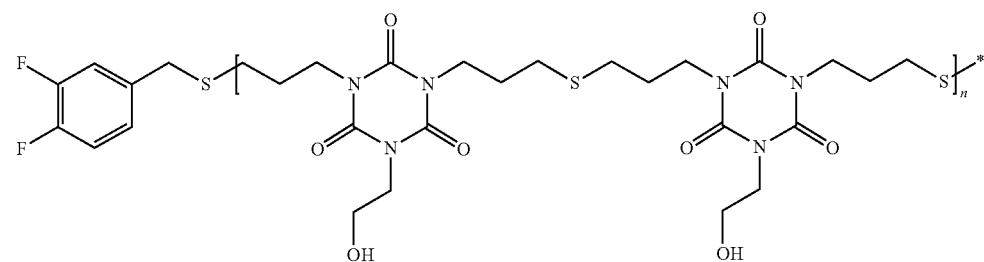

Synthesis Example 3

10 g of 1,3-diallyl-5-(2-hydroxyethyl)-isocyanurate, 4.4 g of 2,3-dimercapto-1-propanol, 0.52 g of AIBN, and 20 g of N,N-dimethyl formamide (DMF) were put in a 100 mL round flask equipped with a condenser and then, heated while stirred with a magnetic bar to perform a polymerization reaction at 55° C. After the reaction proceeded for 3 hours, 2 g of 4-mercaptophenyl acetic acid was added thereto and then, additionally reacted for 5 hours, and the temperature was decreased to room temperature (23° C. to 25° C.) to complete the reaction. Then, tetrahydrofuran (THF) was put for dilution in the reactor wherein the polymerization was complete, and toluene, IPA (isopropyl alcohol), and heptane were used for purification to obtain a polymer (Mw=4,500) including a moiety represented by Chemical Formula 14a.

[Chemical Formula 14a]

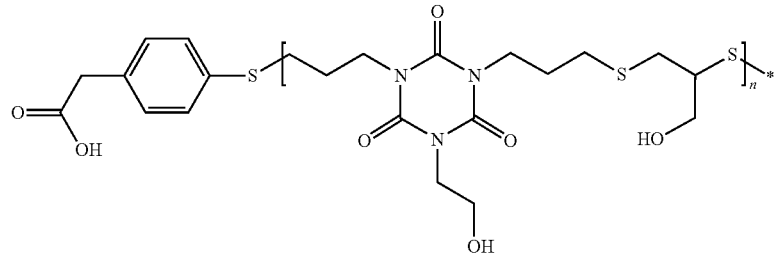

Synthesis Example 4

15 g of 1,3-diallyl-5-(2-hydroxyethyl)-isocyanurate, 7 g of bis(2-mercaptoethyl) ether, 0.7 g of AIBN, and 15 g of N,N-dimethyl formamide (DMF) were put in a 100 mL round flask equipped with a condenser to perform a polymerization reaction at 55° C. After the reaction proceeded for 10 hours, 2 g of 1-phenylethyl mercaptan was added thereto and additionally reacted for 5 hours, and the temperature was decreased to room temperature (23° C. to 25° C.) to complete the reaction. In the reactor wherein the polymerization was complete, tetrahydrofuran (THF) was put for dilution, and toluene, IPA (isopropyl alcohol), and heptane were used for purification to obtain a polymer (Mw=7,000) including a moiety represented by Chemical Formula 15a.

[Chemical Formula 15a]

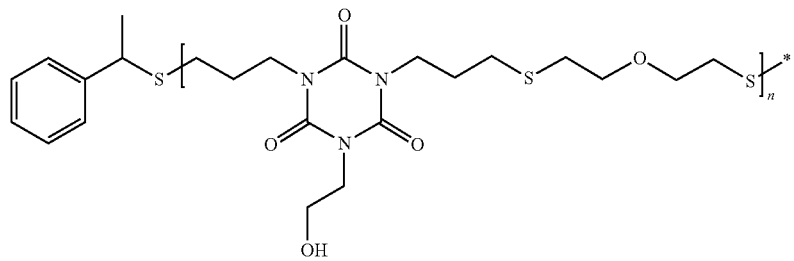

Synthesis Example 5

10 g of 1,3-diallyl-5-(2-hydroxyethyl)-isocyanurate, 4.1 g of 1,2-ethanedithiol, 0.36 g of v-601, and 22 g of N,N-dimethyl formamide (DMF) were put in a 100 mL round flask equipped with a condenser to perform a polymerization reaction at 60° C. After the reaction proceeded for 5 hours, 1.4 g of 3-(allyloxy)benzoic acid was added thereto and additionally reacted for 2 hours, and the temperature was decreased to room temperature (23° C. to 25° C.) to complete the reaction. In the reactor in which the polymerization was complete, tetrahydrofuran (THF) was put for dilution, and toluene, IPA (isopropyl alcohol), and heptane were used for purification to obtain a polymer (Mw=3,300) including a moiety represented by Chemical Formula 16a

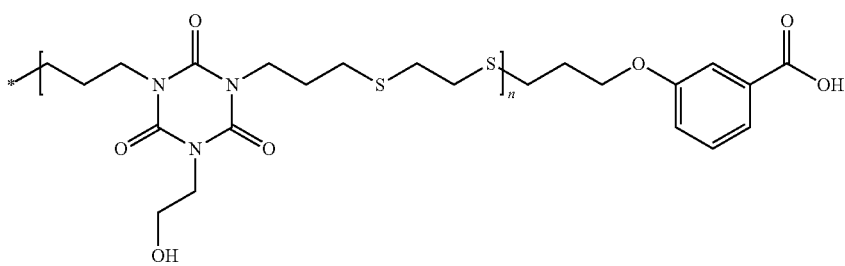

[Chemical Formula 16a]

Comparative Synthesis Example 1

15 g of 1,3-diallyl-5-(2-hydroxyethyl)-isocyanurate, 7.5 g of bis(2-mercaptoethyl) ether, 0.7 g of AIBN, and 15 g of N,N-dimethyl formamide (DMF) were put in a 100 mL round flask equipped with a condenser to perform a polymerization reaction at 55° C. After the reaction proceeded for 10 hours, the temperature was decreased to room temperature (23° C. to 25° C.) to complete the reaction. In the reactor in which the polymerization was complete, tetrahydrofuran (THF) was put for dilution, and toluene, IPA (isopropyl alcohol), and heptane were used for purification to obtain a polymer (Mw=5,800) including a moiety represented by Chemical Formula 17a.

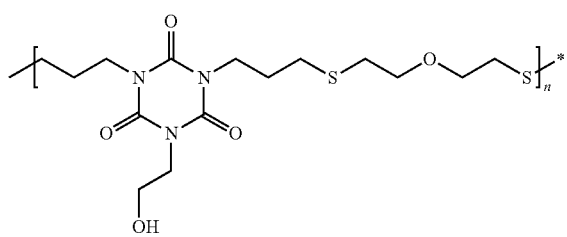

[Chemical Formula 17a]

Preparation of Resist Underlayer Composition

Examples 1 to 5 and Comparative Example 1

Example 1

20 parts by weight of PD1174 (TCI; a curing agent) and 2 parts by weight of pyridinium p-toluenesulfonate based on 100 parts by weight of the polymer according to Synthesis Example 1 were dissolved in a mixed solvent of propylene glycol monomethylether, ethyllactate, and cyclohexanone (a mixing weight ratio=3:6:1) and then, stirred for 12 hours to prepare a resist underlayer composition.

An amount of the mixed solvent may be different according to evaluation methods so that the polymer solid content may be 0.2 wt % to 1 wt % based on a total amount of the resist underlayer composition.

Example 2 to Example 5 Each of resist underlayer compositions was prepared according to the same method as Example 1 except for using each polymer according to Synthesis Examples 2 to 5.

Comparative Example 1

A resist underlayer composition was prepared according to the same method as Example 1 except for using the polymer according to Comparative Synthesis Example 1.

Evaluation 1: Film Density

The compositions according to Examples 1 to 5 and Comparative Example 1 were respectively taken by 5 mL capable of forming a thickness of 100 Å and coated on an 8 inch wafer and then, spin-coated at 1,500 rpm by using an auto track ACT8 (TEL Company). Subsequently, the spin-coated compositions were respectively cured at 205° C. for 50 seconds to form 100 Å-thick resist underlayers. Each resist underlayer was measured with respect to density based on a critical angle through an XRR method. The measurement was performed by using X'pert PRO MPD (Panalytical Company).

The results are shown in Table 1.

TABLE 1

|  | Film density (dyne/cm$^2$) |
| --- | --- |
| Example 1 | 1.37 |
| Example 2 | 1.37 |
| Example 3 | 1.44 |
| Example 4 | 1.32 |
| Example 5 | 1.35 |
| Comparative Example 1 | 1.22 |

Referring to Table 1, when the compositions according to Examples 1 to 5 were respectively formed into resist underlayers, density thereof was improved compared with the resist underlayer formed of the composition according to Comparative Example 1.

Evaluation 2: Coating Uniformity

The compositions according to Examples 1 to 5 and Comparative Example 1 were respectively taken by 5 mL capable of forming a thickness of 100 Å and coated on an 8 inch wafer and then, spin-coated at 1,500 rpm by using an auto track ACT8 (TEL Company). Subsequently, the spin-coated compositions were respectively cured at 205° C. for 50 seconds to form 100 Å-thick resist underlayers, and thicknesses at 51 points in a horizontal axis were measured to compare coating uniformity. The thicknesses were measured through Opti-2600 (Thermawave) by applying ellipsometry, and the results are shown in Table 2.

In Table 2, the smaller coating uniformity (%) is, the more excellent coating uniformity is.

TABLE 2

|  | Coating uniformity (%) |
| --- | --- |
| Example 1 | 1.7% |
| Example 2 | 1.2% |
| Example 3 | 1.5% |
| Example 4 | 0.9% |

TABLE 2-continued

|  | Coating uniformity (%) |
|---|---|
| Example 5 | 2.1% |
| Comparative Example 1 | 4.8% |

Referring to Table 2, the resist underlayer compositions according to Examples 1 to 5 exhibited coating uniformity compared with the resist underlayer composition according to Comparative Example 1.

Evaluation 3: Pin-hole Evaluation

The compositions according to Examples 1 to 5 and Comparative Example 1 were respectively taken by 5 mL capable of forming a thickness of 100 Å and coated on an 8 inch wafer and then, spin-coated at 1,500 rpm by using an auto track ACT8 (TEL Company). Subsequently, the spin-coated compositions were respectively cured at 205° C. for 50 seconds to form 50 Å-thick resist underlayers, and the surfaces of the resist underlayers at the same position of 10 points in a horizontal axis were examined through an optical microscope.

TABLE 3

|  | Pin-hole |
|---|---|
| Example 1 | No |
| Example 2 | No |
| Example 3 | No |
| Example 4 | No |
| Example 5 | No |

Referring to Table 3, the resist underlayer compositions according to Examples 1 to 5 were uniformly well coated into films without pin-holes even when the films were 50 Å-thick ultrathin.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A resist underlayer composition, comprising
a polymer comprising a structure represented by Chemical Formula 1 at the terminal end and a structural unit represented by Chemical Formula 2 and a structural unit represented by Chemical Formula 3 in the main chain; and
a solvent:

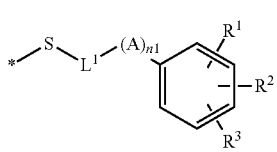

[Chemical Formula 1]

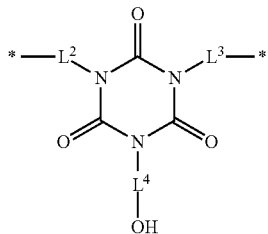

[Chemical Formula 2]

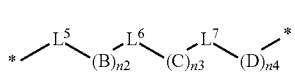

[Chemical Formula 3]

wherein, in Chemical Formula 1 to Chemical Formula 3, $L^1$ to $L^7$ are independently a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C2 to C30 alkenylene group, a substituted or unsubstituted C2 to C30 alkynylene group, or a combination thereof, A, B, C, and D are independently O, S, $S(O_2)$, C(O), C(O)O, $NR^a$, or $C(O)NR^b$, at least one of B, C, and D is S, n1, n2, n3, and n4 are independently one of integers of 0 to 3, provided that at least one of n2, n3, and n4 is an integer of 1 or more, $R^a$, $R^b$ and $R^1$ to $R^3$ are independently hydrogen, deuterium, a hydroxy group, a thiol group, a halogen, a carboxyl group, acetyl group, an amino group, a cyano group, a nitro group, a substituted or unsubstituted C1 to C30 alkyl group, a substituted or unsubstituted C2 to C30 alkenyl group, a substituted or unsubstituted C6 to C30 aryl group, a substituted or unsubstituted C1 to C10 alkoxy group, a substituted or unsubstituted C1 to C30 acyl group, or a combination thereof, and

* is a linking point.

2. The resist underlayer composition of claim 1, wherein $R^1$ to $R^3$ are independently hydrogen, a hydroxy group, a thiol group, a halogen, a carboxyl group, an amino group, a cyano group, a nitro group, a substituted or unsubstituted C1 to C30 alkyl group, a substituted or unsubstituted C2 to C30 alkenyl group, a substituted or unsubstituted C6 to C30 aryl group, a substituted or unsubstituted C1 to C10 alkoxy group, a substituted or unsubstituted C1 to C30 acyl group, or a combination thereof.

3. The resist underlayer composition of claim 1, wherein $R^1$ to $R^3$ are independently hydrogen, a hydroxy group, a halogen, a carboxyl group, a carboxymethyl group, an acetyl group, or a combination thereof.

4. The resist underlayer composition of claim 1, wherein above Chemical Formula 1 is a structure represented by Chemical Formula 1-1:

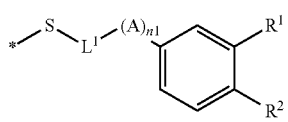
[Chemical Formula 1-1]

wherein, in Chemical Formula 1-1,
L¹ is a single bond or a substituted or unsubstituted C1 to C30 alkylene group,
A is O, S, S(O₂), C(O), C(O)O, NR$^a$, or C(O)NR$^b$, and n1 is one of integers of 0 to 3, and
R¹ and R² are independently hydrogen, a hydroxy group, a halogen, a carboxyl group, a carboxymethyl group, an acetyl group, or a combination thereof.

5. The resist underlayer composition of claim 1, wherein the polymer comprises at least one of structural units represented by Chemical Formula 4 to Chemical Formula 6:

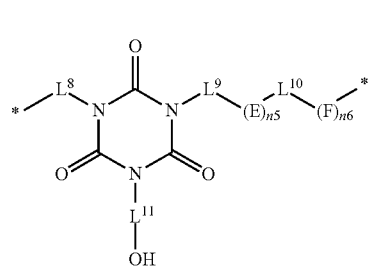
[Chemical Formula 4]

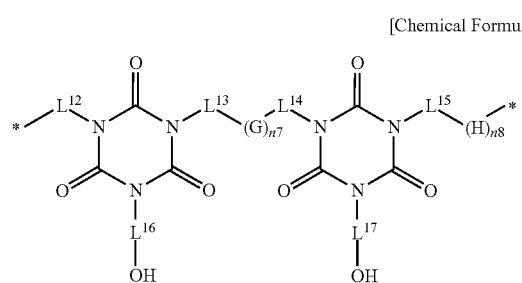
[Chemical Formula 5]

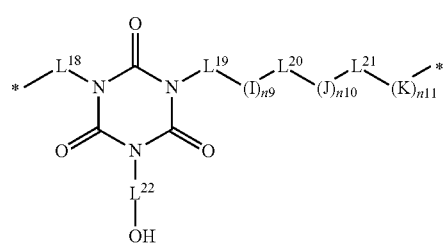
[Chemical Formula 6]

wherein, in Chemical Formulae 4 to 6,
L⁸ to L²² are independently a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C2 to C30 alkenylene group, a substituted or unsubstituted C2 to C30 alkynylene group, or a combination thereof,
E, F, G, H, I, J, and K are independently O, S, S(O₂), C(O), C(O)O, NR$^a$, or C(O)NR$^b$,
at least one of E and F is S,
at least one of G and H is S,
at least one of I, J, and K is S,
n5 to n11 are independently one of integers of 0 to 3,
at least one of n5 and n6 is an integer of 1 or more,
at least one of n7 and n8 is an integer of 1 or more,
at least one of n9 to n11 is an integer of 1 or more, and
* is a linking point.

6. A resist underlayer composition, comprising
a polymer comprising a structure represented by Chemical Formula 1 at the terminal end and a structural unit represented by Chemical Formula 2 and a structural unit represented by Chemical Formula 3 in the main chain; and
a solvent:

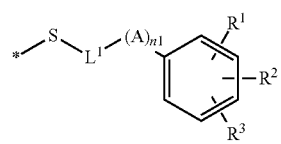
[Chemical Formula 1]

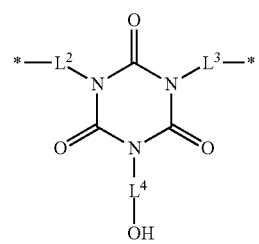
[Chemical Formula 2]

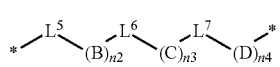
[Chemical Formula 3]

wherein, in Chemical Formula 1 to Chemical Formula 3,
L¹ to L⁷ are independently a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C2 to C30 alkenylene group, a substituted or unsubstituted C2 to C30 alkynylene group, or a combination thereof,
A, B, C, and D are independently O, S, S(O₂), C(O), C(O)O, NR$^a$, or C(O)NR$^b$, at least one of B, C, and D is S, n1, n2, n3, and n4 are independently one of integers of 0 to 3, provided that at least one of n2, n3, and n4 is an integer of 1 or more, $R^a$, $R^b$ and $R^1$ to $R^3$ are independently hydrogen, deuterium, a hydroxy group, a thiol group, a halogen, a carboxyl group, acetyl group, an amino group, a cyano group, a nitro group, a substituted or unsubstituted C1 to C30 alkyl group, a substituted or unsubstituted C2 to C30 alkenyl group, a substituted or unsubstituted C6 to C30 aryl group, a substituted or unsubstituted C1 to C10 alkoxy group, a substituted or unsubstituted C1 to C30 acyl group, or a combination thereof, and

* is a linking point, wherein the polymer comprises a moiety represented by one of Chemical Formula 7 to Chemical Formula 11:

[Chemical Formula 7]

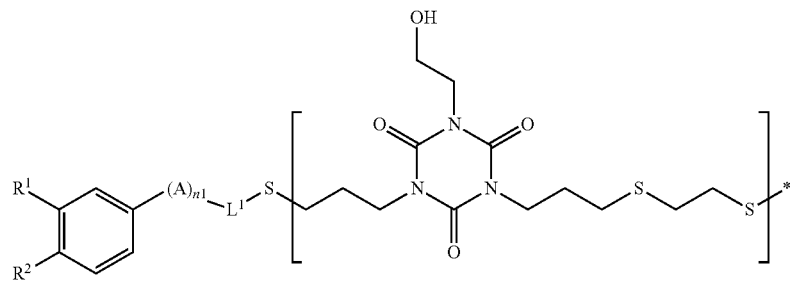

[Chemical Formula 8]

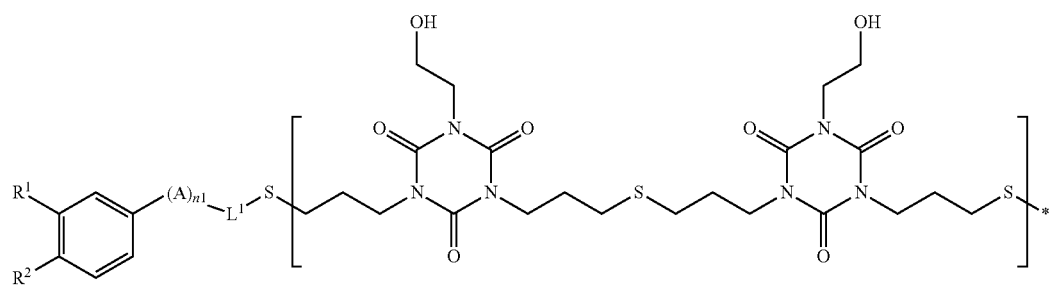

[Chemical Formula 9]

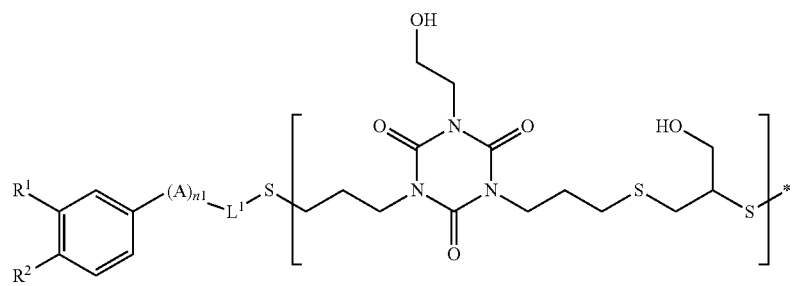

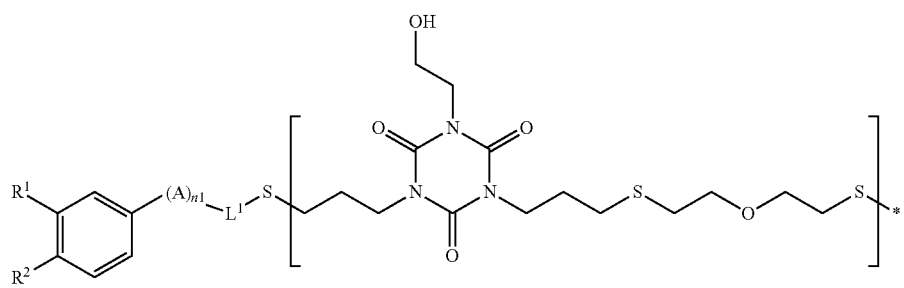

[Chemical Formula 10]

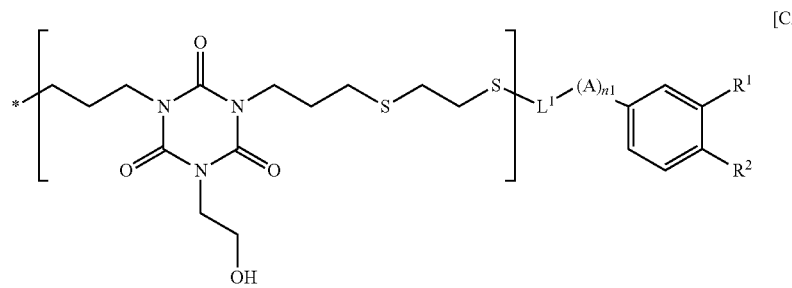

[Chemical Formula 11]

wherein, in Chemical Formula 7 to Chemical Formula 11,
L¹ is a single bond or a substituted or unsubstituted C1 to C30 alkylene group,
A is O, S, S(O₂), C(O), C(O)O, NR$^a$, or C(O)NR$^b$, and
n1 is one of integers of 0 to 3, and
R¹ and R² are independently hydrogen, a hydroxy group, a halogen, a carboxyl group, a carboxymethyl group, an acetyl group, or a combination thereof.

7. A resist underlayer composition, comprising
a polymer comprising a structure represented by Chemical Formula 1 at the terminal end and a structural unit represented by Chemical Formula 2 and a structural unit represented by Chemical Formula 3 in the main chain; and
a solvent:

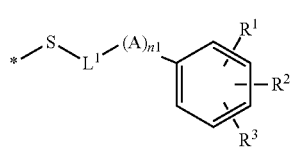

[Chemical Formula 1]

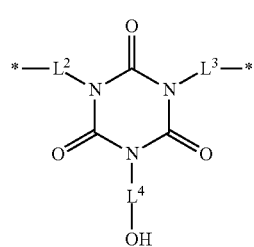

[Chemical Formula 2]

[Chemical Formula 3]

*—L⁵—(B)$_{n2}$—L⁶—(C)$_{n3}$—L⁷—(D)$_{n4}$—* wherein, in Chemical Formula 1 to Chemical Formula 3,
L¹ to L⁷ are independently a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C2 to C30 alkenylene group, a substituted or unsubstituted C2 to C30 alkynylene group, or a combination thereof,
A, B, C, and D are independently O, S, S(O₂), C(O), C(O)O, NR$^a$, or C(O)NR$^b$,
at least one of B, C, and D is S,
n1, n2, n3, and n4 are independently one of integers of 0 to 3, provided that at least one of n2, n3, and n4 is an integer of 1 or more,
R$^a$, R$^b$ and R¹ to R³ are independently hydrogen, deuterium, a hydroxy group, a thiol group, a halogen, a carboxyl group, acetyl group, an amino group, a cyano group, a nitro group, a substituted or unsubstituted C1 to C30 alkyl group, a substituted or unsubstituted C2 to C30 alkenyl group, a substituted or unsubstituted C6 to C30 aryl group, a substituted or unsubstituted C1 to C10 alkoxy group, a substituted or unsubstituted C1 to C30 acyl group, or a combination thereof, and
* is a linking point,
wherein the polymer comprises a moiety represented by one of Chemical Formula 12 to Chemical Formula 16:

[Chemical Formula 12]
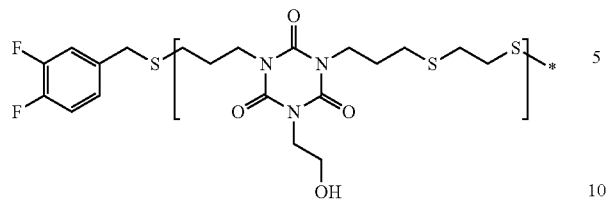
[Chemical Formula 13]
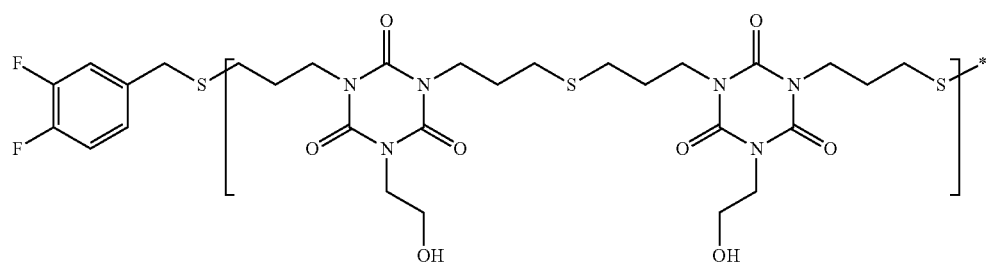
[Chemical Formula 14]
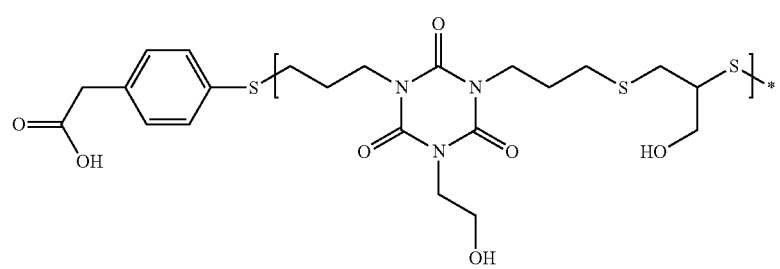
[Chemical Formula 15]
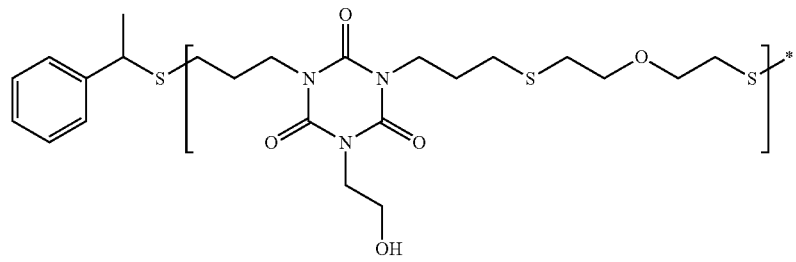

[Chemical Formula 16]

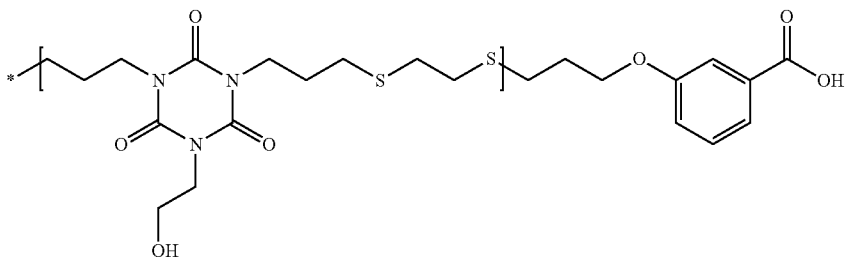

wherein, in Chemical Formula 12 to Chemical Formula 16, * is a linking point.

8. The resist underlayer composition of claim 1, wherein the polymer has a weight average molecular weight 1,000 to 100,000.

9. The resist underlayer composition of claim 1, wherein the polymer is included in an amount of 0.1 wt % to 50 wt % based on a total amount of the composition.

10. The resist underlayer composition of claim 1, which further comprises at least one polymer of an acryl-based resin, an epoxy-based resin, a novolac resin, a glycoluril-based resin, and a melamine-based resin.

11. The resist underlayer composition of claim 1, which further comprises at least one additive of a surfactant, a thermal acid generator, a plasticizer, and a combination thereof.

12. A method of forming patterns, comprising
forming an etching object layer on a substrate,
coating the resist underlayer composition of claim 1 on the etching object layer to form a resist underlayer,
forming a photoresist pattern on the resist underlayer, and
etching the resist underlayer and the etching object layer sequentially using the photoresist pattern as an etching mask.

13. The method of forming patterns of claim 12, wherein the forming of the photoresist pattern comprises
forming a photoresist layer on the resist underlayer,
exposing the photoresist layer, and
developing the photoresist layer.

14. The method of forming patterns of claim 12, wherein after coating the resist underlayer composition, the forming of the resist underlayer further comprises heat-treating the resist underlayer composition at a temperature of 100° C. to 500° C.

* * * * *